US010153776B2

(12) United States Patent
Demura et al.

(10) Patent No.: US 10,153,776 B2
(45) Date of Patent: Dec. 11, 2018

(54) FREQUENCY SYNTHESIZER

(71) Applicant: NIHON DEMPA KOGYO CO., LTD., Tokyo (JP)

(72) Inventors: Hiroyuki Demura, Saitama (JP); Kaoru Kobayashi, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 15/517,520

(22) PCT Filed: Sep. 24, 2015

(86) PCT No.: PCT/JP2015/076896
§ 371 (c)(1),
(2) Date: Apr. 7, 2017

(87) PCT Pub. No.: WO2016/056389
PCT Pub. Date: Apr. 14, 2016

(65) Prior Publication Data
US 2017/0310331 A1 Oct. 26, 2017

(30) Foreign Application Priority Data

Oct. 8, 2014 (JP) .................. 2014-207428
Jul. 2, 2015 (JP) .................. 2015-133738

(51) Int. Cl.
*H03B 21/00* (2006.01)
*H03L 7/18* (2006.01)
(Continued)

(52) U.S. Cl.
CPC ............... *H03L 7/18* (2013.01); *G06F 1/022* (2013.01); *H03L 7/091* (2013.01); *H03L 7/183* (2013.01)

(58) Field of Classification Search
None
See application file for complete search history.

(56) References Cited

U.S. PATENT DOCUMENTS 5,801,589 A * 9/1998 Tajima .................. H03L 7/1806
331/1 R
6,636,086 B2 * 10/2003 Mar ....................... H03B 21/02
327/105

(Continued)

FOREIGN PATENT DOCUMENTS

JP H08-256058 10/1996
JP H10-022825 1/1998
(Continued)

OTHER PUBLICATIONS

"International Search Report (Form PCT/ISA/210) of PCT/JP2015/076896", dated Nov. 17, 2015, with English translation thereof, pp. 1-4.

*Primary Examiner* — Lincoln Donovan
*Assistant Examiner* — Khareem E Almo
(74) *Attorney, Agent, or Firm* — JCIPRNET

(57) ABSTRACT

The present invention provides a frequency synthesizer that is switchable at a high speed and includes a few unnecessary frequency components in an output frequency signal. In a frequency synthesizer 1, a DDS 2 operates based on a clock signal to generate a reference frequency signal with a predetermined reference frequency, and clock signal supply units 41 and 42 switch the clock signals that have different clock frequencies to supply to the DDS 2. When the clock signals are switched to operate the DDS 2, the storage unit 12 stores a combination of a clock frequency $f_{clk}$, a reference frequency $f_c$, and a dividing number N in association with an output frequency $f_{VCO}$ of the frequency synthesizer 1 such that a spurious frequency does not exist within a predetermined frequency range and a dividing number of a variable frequency divider 302 disposed on a PLL circuit 3 is minimum. Setting units 11 and 24 read setting items stored in the storage unit 12 to set respective units.

6 Claims, 15 Drawing Sheets

(51) Int. Cl.
  *H03L 7/091* (2006.01)
  *G06F 1/02* (2006.01)
  *H03L 7/183* (2006.01)

(56) References Cited

U.S. PATENT DOCUMENTS

| | | | | |
|---|---|---|---|---|
| 9,093,996 | B2* | 7/2015 | Yamashina | ............ H03K 4/026 |
| 2011/0009083 | A1* | 1/2011 | Namba | ................. H03B 21/02 |
| | | | | 455/318 |
| 2012/0313680 | A1* | 12/2012 | Kodama | .............. H04B 1/1027 |
| | | | | 327/157 |
| 2017/0099057 | A1* | 4/2017 | Josefsberg | ................ H03L 7/07 |
| 2017/0099058 | A1* | 4/2017 | Josefsberg | .............. H03L 7/085 |

FOREIGN PATENT DOCUMENTS

| | | |
|---|---|---|
| JP | 2000-332539 | 11/2000 |
| JP | 2002-141797 | 5/2002 |
| JP | 2002-217724 | 8/2002 |
| JP | 2007-208367 | 8/2007 |

* cited by examiner

| VCO output $f_{VCO}$ [MHz] | Clock frequency $f_{clk}$ [MHz] | DDS used band $f_{clk}/2$ [MHz] | Dividing number N | DDS output $f_c$ [MHz] | Second harmonic $2f_c$ [MHz] Second-order spurious $f_{S2}$ | Third harmonic $3f_c$ [MHz] Third-order spurious $f_{S3}$ | Fourth harmonic $4f_c$ [MHz] Fourth-order spurious $f_{S4}$ | Fifth harmonic $5f_c$ [MHz] Fifth-order spurious $f_{S5}$ | Sixth harmonic $6f_c$ [MHz] Sixth-order spurious $f_{S6}$ |
|---|---|---|---|---|---|---|---|---|---|
| 920 | 200 | 100 | 20 | 46.000 | 92.000 / 92.000 | 138.000 / 62.000 | 184.000 / 16.000 | 230.000 / 30.000 | 276.000 / 76.000 |
|  |  |  | 23 | 40.000 | 80.000 / 80.000 | 120.000 / 80.000 | 160.000 / 40.000 | 200.000 / 0.000 | 240.000 / 40.000 |
|  |  |  | 26 | 35.385 | 70.769 / 70.769 | 106.154 / 93.846 | 141.538 / 58.462 | 176.923 / 23.077 | 212.308 / 12.308 |
|  |  |  | 29 | 31.724 | 63.448 / 63.448 | 95.172 / 95.172 | 126.897 / 73.103 | 158.621 / 41.379 | 190.345 / 9.655 |
|  | 240 | 120 | 20 | 46.000 | 92.000 / 92.000 | 138.000 / 102.000 | 184.000 / 56.000 | 230.000 / 10.000 | 276.000 / 36.000 |
|  |  |  | 23 | 40.000 | 80.000 / 80.000 | 120.000 / 120.000 | 160.000 / 80.000 | 200.000 / 40.000 | 240.000 / 0.000 |
|  |  |  | 26 | 35.385 | 70.769 / 70.769 | 106.154 / 106.154 | 141.538 / 98.462 | 176.923 / 63.077 | 212.308 / 27.692 |
|  |  |  | 29 | 31.724 | 63.448 / 63.448 | 95.172 / 95.172 | 126.897 / 113.103 | 158.621 / 81.379 | 190.345 / 49.655 |

FIG. 6

| VCO output $f_{VCO}$ [MHz] | Clock frequency $f_{clk}$ [MHz] | DDS used band $f_{clk}/2$ [MHz] | Dividing number N | DDS output $f_c$ [MHz] | Second harmonic $2f_c$ [MHz] Second-order spurious $f_{S2}$ | Third harmonic $3f_c$ [MHz] Third-order spurious $f_{S3}$ | Fourth harmonic $4f_c$ [MHz] Fourth-order spurious $f_{S4}$ | Fifth harmonic $5f_c$ [MHz] Fifth-order spurious $f_{S5}$ | Sixth harmonic $6f_c$ [MHz] Sixth-order spurious $f_{S6}$ |
|---|---|---|---|---|---|---|---|---|---|
| 960 | 200 | 100 | 20 | 48.000 | 96.000 | 144.000 | 192.000 | 240.000 | 288.000 |
| | | | | | 96.000 | 56.000 | 8.000 | 40.000 | 88.000 |
| | | | 23 | 41.739 | 83.478 | 125.217 | 166.957 | 208.696 | 250.435 |
| | | | | | 83.478 | 74.783 | 33.043 | 8.696 | 50.435 |
| | | | 26 | 36.923 | 73.846 | 110.769 | 147.692 | 184.615 | 221.538 |
| | | | | | 73.846 | 89.231 | 52.308 | 15.385 | 21.538 |
| | | | 29 | 33.103 | 66.207 | 99.310 | 132.414 | 165.517 | 198.621 |
| | | | | | 66.207 | 99.310 | 67.586 | 34.483 | 1.379 |
| | 240 | 120 | 20 | 48.000 | 96.000 | 144.000 | 192.000 | 240.000 | 288.000 |
| | | | | | 96.000 | 96.000 | 48.000 | 0.000 | 48.000 |
| | | | 23 | 41.739 | 83.478 | 125.217 | 166.957 | 208.696 | 250.435 |
| | | | | | 83.478 | 114.783 | 73.043 | 31.304 | 10.435 |
| | | | 26 | 36.923 | 73.846 | 110.769 | 147.692 | 184.615 | 221.538 |
| | | | | | 73.846 | 110.769 | 92.308 | 55.385 | 18.462 |
| | | | 29 | 33.103 | 66.207 | 99.310 | 132.414 | 165.517 | 198.621 |
| | | | | | 66.207 | 99.310 | 107.586 | 74.483 | 41.379 |

FIG. 7

| VCO output $f_{vco}$ [MHz] | Clock frequency $f_{clk}$ [MHz] | DDS used band $f_{clk}/2$ [MHz] | Dividing number N | DDS output $f_c$ [MHz] | Second harmonic $2f_c$ [MHz] | Second-order spurious $f_{S2}$ | Third harmonic $3f_c$ [MHz] | Third-order spurious $f_{S3}$ | Fourth harmonic $4f_c$ [MHz] | Fourth-order spurious $f_{S4}$ | Fifth harmonic $5f_c$ [MHz] | Fifth-order spurious $f_{S5}$ | Sixth harmonic $6f_c$ [MHz] | Sixth-order spurious $f_{S6}$ |
|---|---|---|---|---|---|---|---|---|---|---|---|---|---|---|
| 1000 | 200 | 100 | 20 | 50.000 | 100.000 | 100.000 | 150.000 | 50.000 | 200.000 | 0.000 | 250.000 | 50.000 | 300.000 | 100.000 |
| | | | 23 | 43.478 | 86.957 | 86.957 | 130.435 | 69.565 | 173.913 | 26.087 | 217.391 | 17.391 | 260.870 | 60.870 |
| | | | 26 | 38.462 | 76.923 | 76.923 | 115.385 | 84.615 | 153.846 | 46.154 | 192.308 | 7.692 | 230.769 | 30.769 |
| | | | 29 | 34.483 | 68.966 | 68.966 | 103.448 | 96.552 | 137.931 | 62.069 | 172.414 | 27.586 | 206.897 | 6.897 |
| | 240 | 120 | 20 | 50.000 | 100.000 | 100.000 | 150.000 | 90.000 | 200.000 | 40.000 | 250.000 | 10.000 | 300.000 | 60.000 |
| | | | 23 | 43.478 | 86.957 | 86.957 | 130.435 | 90.000 | 173.913 | 66.087 | 217.391 | 22.609 | 260.870 | 20.870 |
| | | | 26 | 38.462 | 76.923 | 76.923 | 115.385 | 115.385 | 153.846 | 86.154 | 192.308 | 47.692 | 230.769 | 9.231 |
| | | | 29 | 34.483 | 68.966 | 68.966 | 103.448 | 103.448 | 137.931 | 102.069 | 172.414 | 67.586 | 206.897 | 33.103 |

FIG. 8

| VCO output $f_{VCO}$ [MHz] | Clock frequency $f_{clk}$ [MHz] | DDS used band $f_{clk}/2$ [MHz] | Dividing number N | DDS output $f_c$ [MHz] | Second harmonic $2f_c$ [MHz] / Second-order spurious $f_{S2}$ | Third harmonic $3f_c$ [MHz] / Third-order spurious $f_{S3}$ | Fourth harmonic $4f_c$ [MHz] / Fourth-order spurious $f_{S4}$ | Fifth harmonic $5f_c$ [MHz] / Fifth-order spurious $f_{S5}$ | Sixth harmonic $6f_c$ [MHz] / Sixth-order spurious $f_{S6}$ |
|---|---|---|---|---|---|---|---|---|---|
| 1040 | 200 | 100 | 20 | 52.000 | 104.000 / 96.000 | 156.000 / 44.000 | 208.000 / 8.000 | 260.000 / 60.000 | 312.000 / 88.000 |
| | | | 23 | 45.217 | 90.435 / 90.435 | 135.652 / 64.348 | 180.870 / 19.130 | 226.087 / 26.087 | 271.301 / 71.304 |
| | | | 26 | 40.000 | 80.000 / 80.000 | 120.000 / 80.000 | 160.000 / 40.000 | 200.000 / 0.000 | 240.000 / 40.000 |
| | | | 29 | 35.862 | 71.724 / 71.724 | 107.586 / 92.414 | 141.448 / 56.552 | 179.310 / 20.690 | 215.172 / 15.172 |
| | 240 | 120 | 20 | 52.000 | 104.000 / 104.000 | 156.000 / 84.000 | 208.000 / 32.000 | 260.000 / 20.000 | 312.000 / 72.000 |
| | | | 23 | 45.217 | 90.435 / 90.435 | 135.652 / 104.348 | 180.870 / 59.130 | 226.087 / 13.913 | 271.304 / 31.304 |
| | | | 26 | 40.000 | 80.000 / 80.000 | 120.000 / 120.000 | 160.000 / 80.000 | 200.000 / 40.000 | 240.000 / 0.000 |
| | | | 29 | 35.862 | 71.724 / 71.724 | 107.586 / 107.586 | 143.448 / 96.552 | 179.310 / 60.690 | 215.172 / 24.828 |

FIG. 9

| CHANNEL | VCO OUTPUT f [MHz] | CLOCK FREQUENCY $f_{clk}$ [MHz] | DDS OUTPUT fc [MHz] | DIVIDING NUMBER N [-] |
|---|---|---|---|---|
| CH1 | ... | ... | ... | ... |
| ⋮ | ⋮ | ⋮ | ⋮ | ⋮ |
| CH10 | 920 | 200 | 46.000 | 20 |
| CH11 | 960 | 240 | 41.739 | 23 |
| CH12 | 1000 | 240 | 43.478 | 23 |
| CH13 | 1040 | 240 | 52.000 | 20 |
| ⋮ | ⋮ | ⋮ | ⋮ | ⋮ |
| CH100 | ... | ... | ... | ... |

FIG. 10

| Memory address | VCO output frequency range $F_{VCO}$ [Mhz] | Clock frequency $F_{clk}$ [Mhz] | DDS output coarse frequency Setting Data $F_{Data}'$ [Mhz] | Dividing number N [−] |
|---|---|---|---|---|
| 0000 | 1.000~1.099 | ... | ... | ... |
| 0001 | 1.100~1.199 | ... | ... | ... |
| ⋮ | ⋮ | ⋮ | ⋮ | ⋮ |
| 1989 | 199.900~199.999 | 200 | $F_{Data}$(199.900) | 20 |
| 1990 | 200.000~200.099 | 240 | $F_{Data}$(200.000) | 32 |
| ⋮ | ⋮ | ⋮ | ⋮ | ⋮ |

FIG. 15A

| Memory address | Clock frequency setting data | DDS output coarse frequency setting data | Dividing number setting data |
|---|---|---|---|
| 0000 | ... | ... | ... |
| 0001 | ... | ... | ... |
| ⋮ | ⋮ | ⋮ | ⋮ |
| 1989 | 0 | 1001··········1010 | 01 |
| 1990 | 1 | 000··········0010 | 10 |
| ⋮ | ⋮ | ⋮ | ⋮ |

FIG. 15B

FREQUENCY SYNTHESIZER

CROSS-REFERENCE TO RELATED APPLICATION

This application is a 371 application of the International PCT application serial no. PCT/JP2015/076896, filed on Sep. 24, 2015, which claims the priority benefits of Japan application no. 2014-207428, filed on Oct. 8, 2014 and Japan application no. 2015-133738, filed on Jul. 2, 2015. The entirety of each of the abovementioned patent applications is hereby incorporated by reference herein and made a part of this specification.

TECHNICAL FIELD

The present invention relates to a frequency synthesizer that includes a PLL circuit that uses a Direct Digital Synthesizer (DDS) to generate a reference frequency signal and compares a phase of a frequency signal with the reference frequency signal so as to output the frequency signal from a voltage control oscillator.

BACKGROUND ART

A frequency synthesizer includes a Phase Locked Loop (PLL) circuit that divides a frequency signal output from a voltage control oscillator by a frequency divider, extracts a phase difference between a phase of the divided frequency signal and a phase of a reference frequency signal by a phase comparator, and feeds a control voltage corresponding to the phase difference back to the voltage control oscillator via a loop filter, and the frequency synthesizer uses the PLL circuit to output a stable frequency signal. Then, the frequency synthesizer variously varies the dividing number of the frequency divider and a dividing number of a frequency divider disposed on the reference frequency signal side so as to output the frequency signal of a desired frequency.

As a method for switching the frequency of the frequency signal output from the above-described frequency synthesizer at a high speed, there has been a method that increases the frequency of the reference frequency signal. However, using the reference frequency signal of the high frequency increases a step width of an output frequency switched corresponding to the dividing number of the frequency divider, thus failing to perform a fine frequency adjustment.

Therefore, as a method for ensuring the fine frequency adjustment while supplying the frequency synthesizer with the reference frequency signal of the high frequency, there has been a method that use a Direct Digital Synthesizer (DDS) as a signal source of the reference frequency signal. The DDS reads amplitude data from a waveform table based on phase data output corresponding to an input timing of a clock signal, thus obtaining the frequency signal of the desired frequency. Using the signal generated by the DDS as the reference frequency signal realizes the high speed switching of the frequency of the frequency signal output from the frequency synthesizer while finely varying.

However, the frequency signal output from the DDS includes a spurious component, and the spurious component causes a quality of the frequency signal output from the frequency synthesizer to decrease. While there are various causes to generate the spurious component, as one of them, there is a case where a higher harmonics component due to a frequency (clock frequency) of the clock signal that causes the DDS to operate appears as a folding noise (aliasing) within a used frequency band of the DDS.

Here, Patent Document 1 discloses a configuration where the frequency synthesizer using the DDS includes a program frequency divider between a reference oscillator that generates the clock signal and the DDS, and preliminarily calculates the frequencies of the spurious corresponding to an output frequency Fo of the DDS, so as to set a dividing of the program frequency divider such that the clock signal that does not have the frequencies of the spurious within a range of the predetermined frequency is supplied to the DDS.

PRIOR ART DOCUMENT

Patent Document

Patent Document 1: Japanese Unexamined Patent Application Publication No. 8-256058, paragraphs 0024, 0026, 0029, and FIG. 1.

SUMMARY OF THE INVENTION

Problems to be Solved by the Invention

The frequency synthesizer disclosed in Patent Document 1 uses the program frequency divider to vary the frequency of the clock signal supplied to the DDS, thus ensuring a generated position of the spurious included in the output of the DDS to be adjusted. As a result, for example, the spurious of a sufficiently high frequency compared with a loop band of the loop filter disposed on the frequency synthesizer is generated, and the loop filter is used to remove the spurious.

However, unnecessary frequency components included in the frequency signal as the output of the frequency synthesizer using the DDS are not limited to the above-described higher harmonics spurious component, and sometimes caused by the configuration of the frequency synthesizer for example. Then, when the frequency of the clock signal supplied to the DDS is changed, it is necessary to consider the influence to these other factors so as to take comprehensive countermeasures.

The present invention has been made under such circumstances, and an object of the present invention is to provide a frequency synthesizer that is configured to switch an output frequency at a high speed and includes a few unnecessary frequency components in an output frequency signal.

Solutions to the Problems

A frequency synthesizer according to the present invention includes a PLL circuit, a DDS, a clock signal supply unit, a storage unit, and a setting unit. The PLL circuit includes a voltage control oscillator, a variable frequency divider, a phase comparator, and a loop filter. The variable frequency divider divides a frequency signal output from the voltage control oscillator. The phase comparator extracts a phase difference between a phase of the divided frequency signal and a phase of a reference frequency signal. The loop filter supplies the voltage control oscillator with a control voltage corresponding to the phase difference. The DDS is configured to operate based on a clock signal to generate the reference frequency signal having a reference frequency. The reference frequency corresponds to a value obtained by dividing a set value of an output frequency of the frequency signal by a dividing number. The frequency signal is output from the voltage control oscillator, the dividing number being set in the variable frequency divider. The clock signal supply unit is configured to supply the clock signal to the DDS from a plurality of preliminarily prepared clock frequencies. The clock signal corresponds to a selected clock frequency. The storage unit stores the clock frequency, the reference frequency, and a minimum dividing number in association with one another. The reference frequency is preliminarily obtained such that a frequency of a spurious component does not exist in a predetermined frequency range and the dividing number of the variable frequency divider is minimum. The spurious component is included in a used frequency band of the DDS while the DDS is operated with the clock signal having the clock frequency selected from the plurality of the clock frequencies so as to generate the reference frequency signal having the reference frequency from the DDS. The setting unit is configured to select a combination of the clock frequency, the reference frequency, and the minimum dividing number corresponding to the set value of the output frequency so as to set the clock signal supply unit, the DDS, and the variable frequency divider.

The above-described frequency synthesizer may include the following features.

(a) The storage unit stores the frequency of the spurious component generated due to the clock frequencies different from one another in association with the clock signal having the clock frequency where an absolute value of a difference between an upper/lower limit value of the frequency range and the frequency of an adjacent spurious component closest to the frequency range becomes maximum, the reference frequency, and the minimum dividing number while the frequency signal with the reference frequency associated with the minimum dividing number is generated by the DDS, and when the clock signal supply unit is prepared for supplying the clock signals such that the frequency of the spurious component does not exist within the predetermined frequency range and the clock frequencies are different from one another.

(b) The DDS includes a DDS setting unit configured to perform a setting of a digital set value corresponding to the reference frequency obtained from the setting unit and operate based on an operation clock supplied from outside, and the clock signal supply unit includes a multiplier configured to multiply the operation clock by multiplication ratios different from one another so as to prepare the clock signals of the plurality of the clock frequencies.

(c) The storage unit stores the reference frequency corresponding to a predetermined representative frequency included in each of a preliminarily divided plurality of frequency ranges in association with the clock frequency and the minimum dividing number for each of the frequency ranges, and the frequency synthesizer includes: a calculation unit configured to calculate which frequency range among the plurality of the frequency ranges has a value to which the set value of the frequency corresponds, and a generating unit configured to generate a reference frequency of the set value of the frequency based on a value obtained by dividing a difference value between the representative frequency in the frequency range specified by the calculation unit and the set value of the frequency by a dividing number set in the variable frequency divider, and a reference frequency stored corresponding to the representative frequency.

(d) A digital/analog conversion unit configured to convert the frequency signal output from the DDS to an analog signal to output. The digital/analog conversion unit operates based on the clock signal supplied from the clock signal supply unit.

Effects of the Invention

According to the present invention, when the frequency synthesizer outputs the frequency signal such that the clock signal for operating the DDS is switched and the reference frequency signal generated in the DDS is used for a phase comparison of the PLL circuit, the combination of the clock frequency and the reference frequency where the spurious component does not exist around the reference frequency signal and the dividing number of the variable frequency divider disposed on the frequency synthesizer is minimum is selected. As the result, the unnecessary frequency component in the frequency signal output from the frequency synthesizer is comprehensively reduced and the phase noise is optimized so as to be lowered.

BRIEF DESCRIPTION OF THE DRAWINGS

FIG. 6 is a table indicating a first example of a calculation of the spurious frequencies.

FIG. 7 is a table indicating a second example of the calculation of the spurious frequencies.

FIG. 8 is a table indicating the third example of the calculation of the spurious frequencies.

FIG. 9 is a table indicating the fourth example of the calculation of the spurious frequencies.

FIG. 10 is exemplary settings of a reference frequency, a dividing number of a variable frequency divider, and a clock frequency which are set on a memory in association with channels.

FIG. 15A and FIG. 15B are explanatory drawings illustrating data registered on the memory in the frequency synthesizer.

DESCRIPTION OF PREFERRED EMBODIMENTS

By referring to FIG. 1 to FIG. 4, a description will be given of an overall configuration of a frequency synthesizer 1 according to an embodiment of the present invention.

The frequency synthesizer 1 includes a PLL circuit 3 that includes a Voltage Controlled Oscillator (VCO: voltage control oscillator) 32 and a DDS 2 that supplies the PLL circuit 3 with a reference frequency signal for a phase comparison, and the frequency synthesizer 1 is configured to output a frequency signal of a frequency $f_{VCO}$ set in association with a plurality of channels from the VCO 32.

Figure 2:
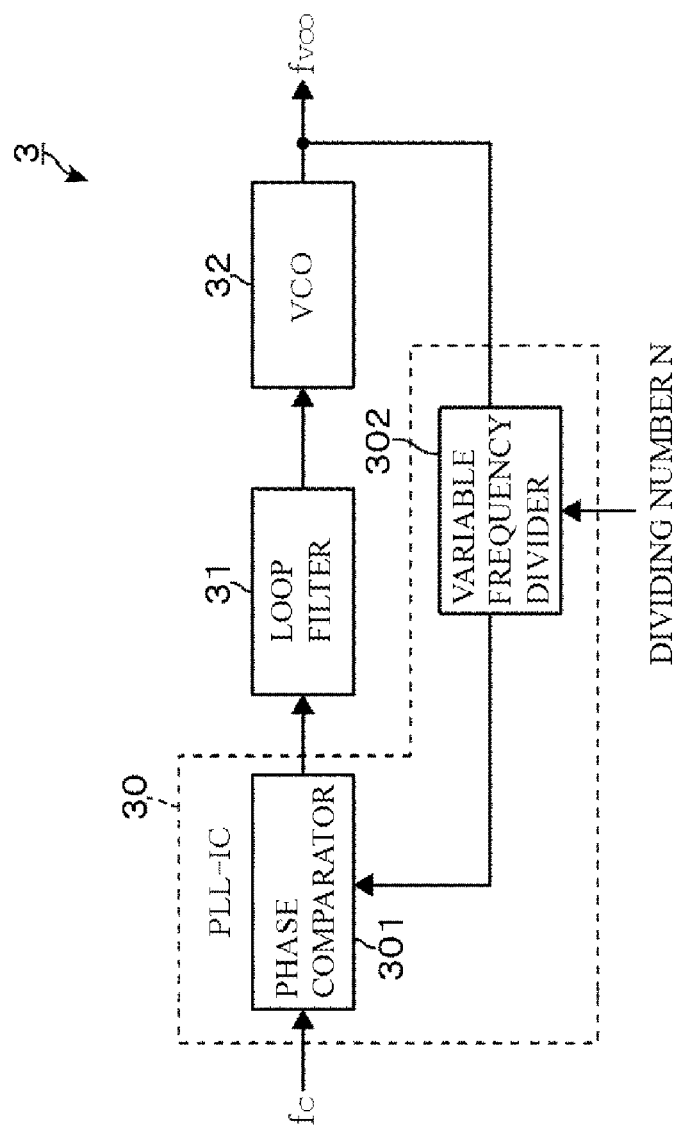
FIG. 2 is a block diagram illustrating a PLL circuit disposed on the frequency synthesizer.

As illustrated in FIG. 2, the PLL circuit 3 includes the VCO 32, a variable frequency divider 302 that divides the frequency signal output from the VCO 32 based on a predetermined dividing number, a phase comparator (phase comparing unit) 301 that compares a phase of a reference frequency signal (reference frequency $f_c$) obtained from the DDS 2 with a phase of the frequency signal divided by the variable frequency divider 302 to output the phase difference, and a loop filter 31 that extracts a control voltage corresponding to the phase difference output from the phase comparator 301 to feed the control voltage back to the VCO 32.

Figure 1:
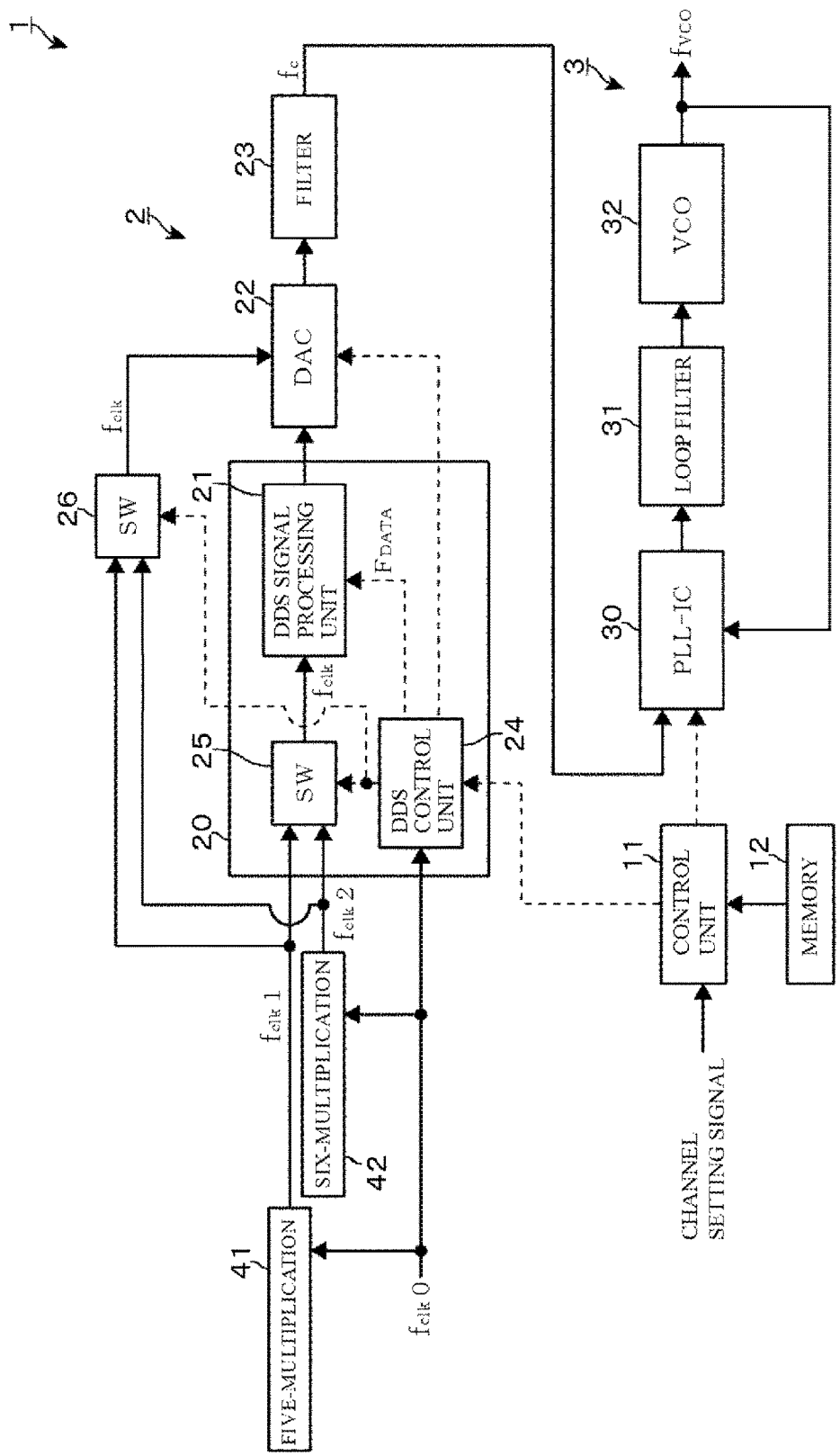
FIG. 1 is a block diagram illustrating an overall configuration of a frequency synthesizer according to an embodiment of the present invention.

As illustrated in FIG. 1 and FIG. 2, the phase comparator 301 and the variable frequency divider 302 in this example are internally disposed on a common PLL-IC 30, and the variable frequency divider 302 is configured to change a dividing number N by a setting signal from outside.

Figure 3:
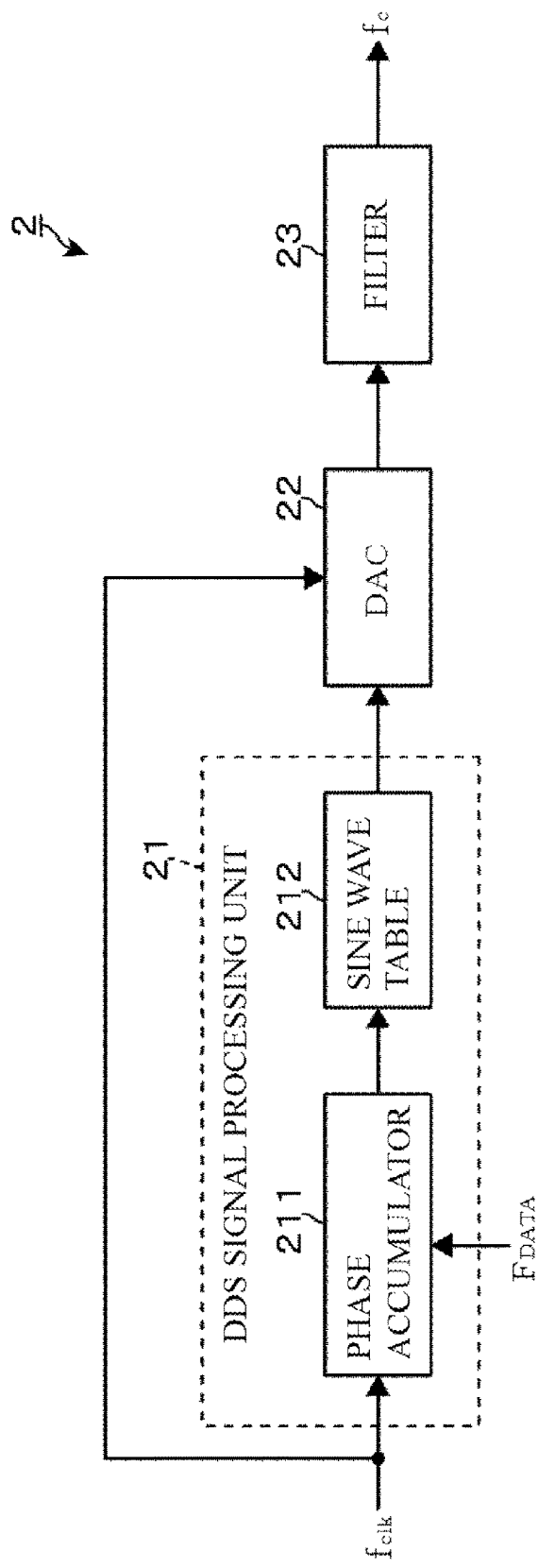
FIG. 3 is a block diagram illustrating a DDS disposed on the frequency synthesizer.

As illustrated in FIG. 3, the DDS 2 includes a phase accumulator 211 that adds to accumulate a digital set value $F_{DATA}$, configured corresponding to the reference frequency $f_c$ to be output, corresponding to an input timing of a clock signal $f_{clk}$ supplied from outside so as to output as phase data of the reference frequency signal $f_c$, a sine wave table 212 that stores amplitude data of a sine wave associating with the phase data so as to output the amplitude data corresponding to the phase data obtained from the phase accumulator 211, a digital/analog conversion unit (Digital Analog Convertor: DAC) 22 that converts the digital signal output from the sine wave table 212 to an analog signal, and a low-pass filter (hereinafter referred to as a "filter") 23 that removes high frequency components included in the reference frequency signal $f_c$. As illustrated in FIG. 1 and FIG. 3, the phase accumulator 211 and the sine wave table 212 in this example are internally disposed on a common DDS signal processing unit 21.

For example, when an adder constituting the phase accumulator 211 has a number of bits of 20 bits (k=20) and the digital value of the clock frequency is $F_{clk}$, a resolution D of the DDS 2 is indicated by a following formula (1) and the digital set value $F_{DATA}$ is obtained with a formula (2). Here, the $F_c$ is a digital value of the reference frequency.

$$D = F_{clk}/(2^{20}) \quad (1)$$

$$F_{DATA} = F_c/D \quad (2)$$
$$= F_c/(F_{clk}/(2^{20}))$$

Figure 4:
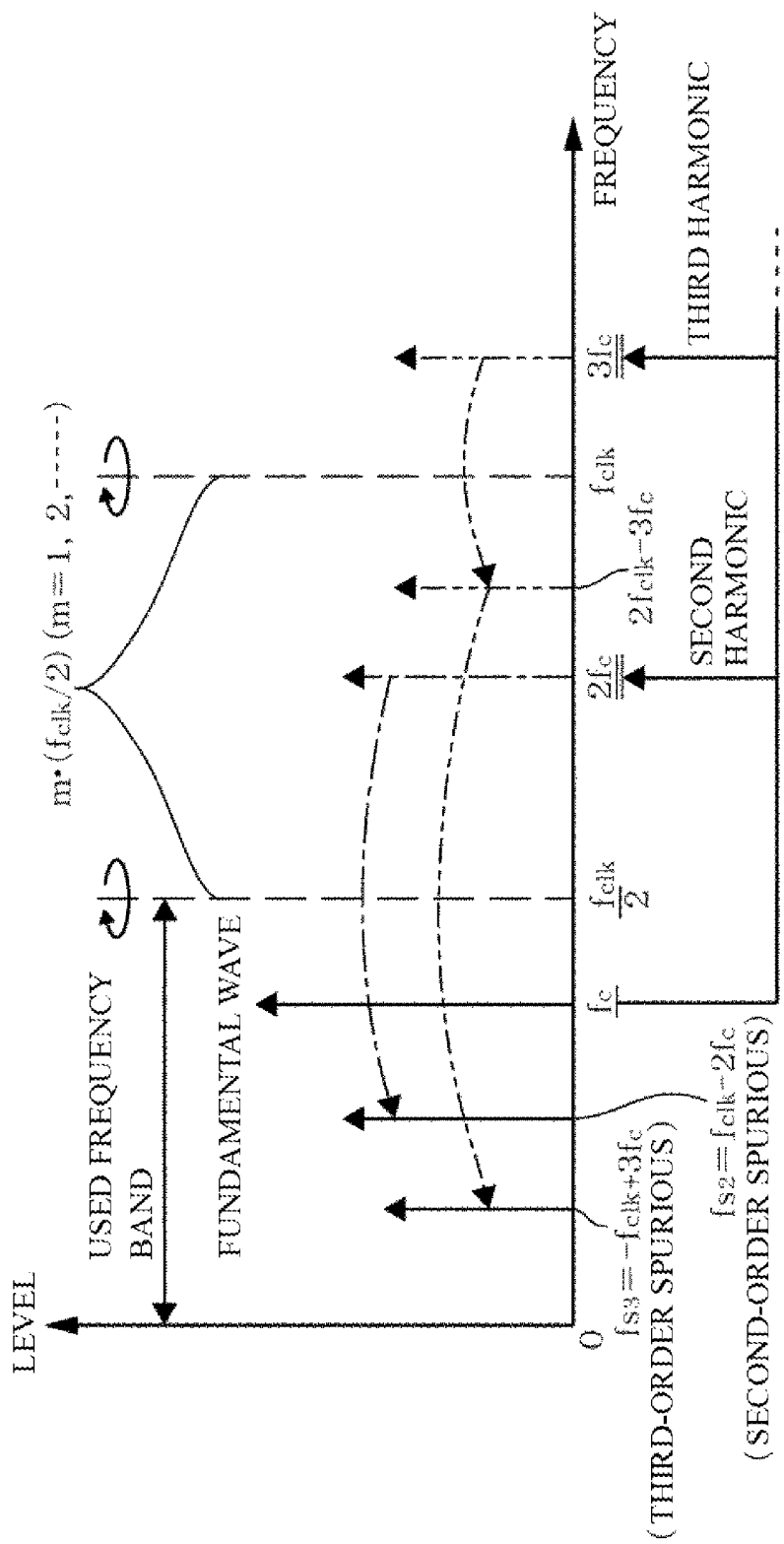
FIG. 4 is an explanatory drawing illustrating a generation pattern of spurious components caused by higher harmonics.

Generally, the frequency signal generated by the DDS 2 includes folding noises of the higher harmonics components as spurious components. FIG. 4 illustrates a generation pattern of the spurious components caused by higher harmonics of the reference frequency signal (reference frequency fc) generated by the DDS 2. When the DDS 2 is operated by the clock signal of the clock frequency fclk, a used frequency band of the DDS 2 is in a range of 0≤fc≤fclk/2. In this used frequency band, the folding noises (aliasing) of the higher harmonics (n·fc, however, n=2, 3, ... ) of the reference frequency signal fc (fundamental wave) appear as the spurious components.

In FIG. 4, the spurious component of the second harmonic ($2f_c$) is generated on a position of a frequency $f_{clk}-2f_c$ folded back on $f_{clk}/2$ as a base point (in FIG. 4, a one-dot chain line indicates a correspondence relation between the frequencies of before and after folded back). The spurious component of the third harmonic ($3f_c$) appears on a position of a frequency $-f_{clk}+3f_c$ as a folding component of a frequency $2f_{clk}-3f_c$, which is generated by folding back $3f_c$ on $f_{clk}$ as a base point, by further folding back on $f_{clk}/2$ as a base point (in FIG. 4, a two-dot chain line indicates a correspondence relation between the frequencies of before and after folded back).

Thus, in considering even the influence of the folding back on the folding position of higher orders of "m·($f_{clk}/2$) (however, m=1, 2, ... )," the spurious components due to the influence of the folding noises appear in the used frequency band of the DDS 2 as the spurious components of, for example, hundreds of the higher harmonics.

Then, a frequency (spurious frequency $f_{Sn}$) of the spurious component of the higher harmonics generated in a range indicated with a following formula (3) is calculated with a following formula (4).

$$\{(2m-1)/2\} \cdot f_{clk} < n \cdot f_c \leq m \cdot f_{clk} \quad (3)$$

$$f_{Sn} = m \cdot f_{clk} - n \cdot f_c \quad (4)$$

(However, m=1, 2, 3, n=2, 3, ... )

Figure 5:
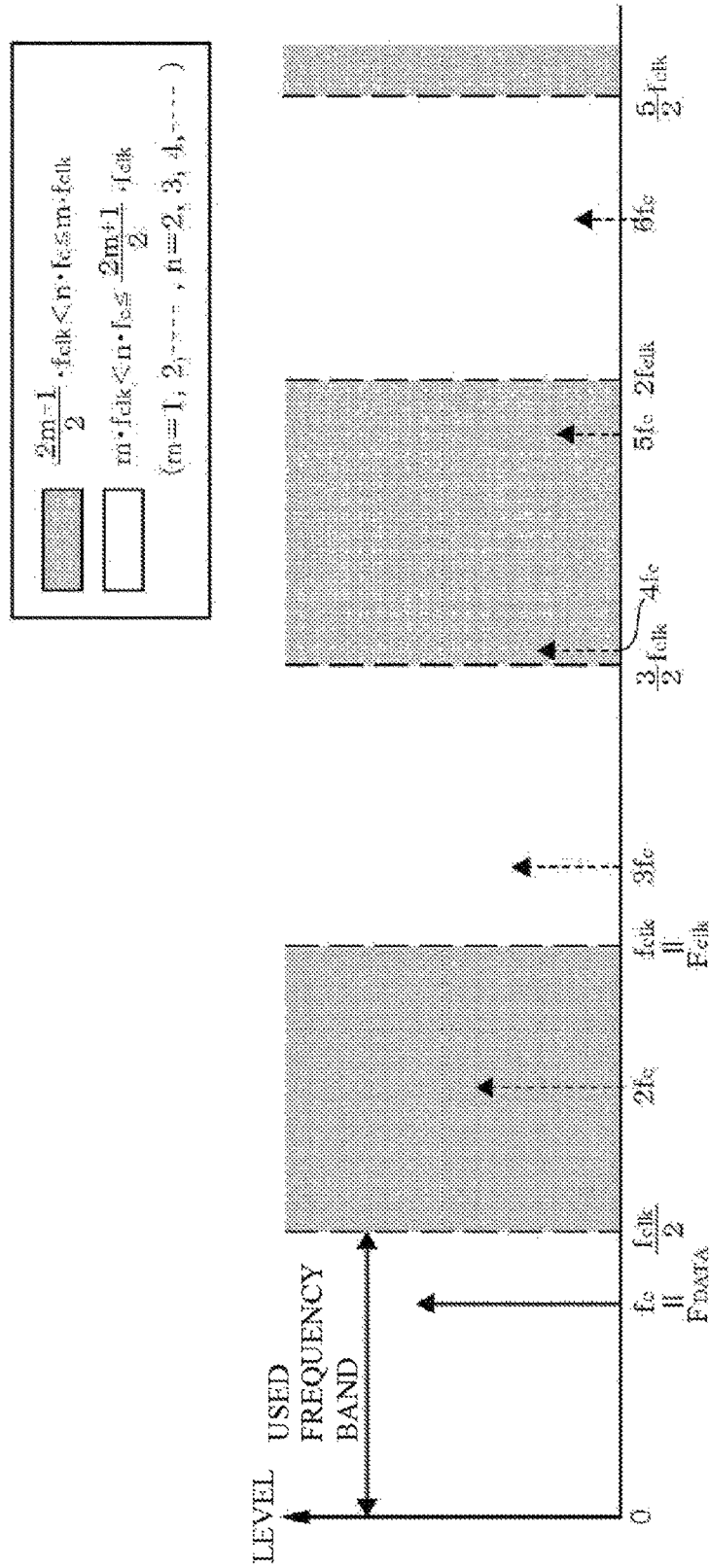
FIG. 5 is an explanatory drawing according to a relation between a generating position of the higher harmonics and a calculation method of spurious frequencies.

In FIG. 5, the ranges corresponding to the formula (3) is indicated in gray.

On the other hand, the spurious frequency of the higher harmonics generated in a range indicated with a following formula (5) is calculated with a following formula (6).

$$m \cdot f_{clk} < n \cdot f_c \leq \{(2m+1)/2\} \cdot f_{clk} \quad (5)$$

$$f_{Sn} = n \cdot f_c - m \cdot f_{clk} \quad (6)$$

(However, m=1, 2, 3, ..., n=2, 3, ... )

In FIG. 5, the ranges corresponding to the formula (5) is indicated in white.

When the dividing number of the variable frequency divider 302 is N, and the phases of the frequency signal after dividing in the PLL circuit 3 and the reference frequency signal are aligned (locked), a relation between the reference frequency $f_c$ and an output frequency $f_{VCO}$ of the VCO 32 is indicated with a following formula (7).

$$f_{VCO} = N \cdot f_c \quad (7)$$

According to the relations of the above-described formulas (3) to (7), when the frequency synthesizer 1 outputs the frequency signal of the frequency $f_{VCO}$, obtaining the clock frequency $f_{clk}$, which causes the PLL circuit 3 to operate, and the dividing number of the variable frequency divider 302 ensures the spurious frequency $f_{Sn}$ to be preliminarily obtained based on the relation between the clock frequency $f_{clk}$ and the reference frequency $f_c$.

The relation indicates that changing the clock frequency $f_{clk}$ can change the generating position of the spurious frequency $f_{Sn}$.

The frequency synthesizer 1 according to the embodiment is configured to change the clock frequency $f_{clk}$ of the clock signal supplied to the DDS 2 based on the above-described consideration.

Relating to the configuration, as illustrated in FIG. 1, the DDS 2 includes a first changeover switch 25 that switches the clock signal supplied to the DDS signal processing unit 21 (phase accumulator 211), a DDS control unit 24 that performs the switching setting of the first changeover switch 25, and a second changeover switch 26 that switches the clock signal supplied to a DAC 22 in accordance with the switching of the clock signal supplied to the DDS signal processing unit 21.

In the DDS 2 of this example, the first changeover switch 25 and the DDS control unit 24 on the DDS signal processing unit 21 side are disposed on a DDS-IC 20 common with the DDS signal processing unit 21. In addition to the switching of the first and second changeover switches 25 and 26 of the DDS signal processing unit 21 and the DAC 22, the DDS control unit 24 has a function to output the digital set value $F_{DATA}$ corresponding to the reference frequency signal $f_c$ to the phase accumulator 211 in the DDS signal processing unit 21, and a function to output a reset signal that causes the DAC 22 to execute a reset operation.

As illustrated in FIG. 1, the clock signal with the clock frequency $f_{clk}$ 0 is supplied to the DDS 2 as an operation clock. Then, outputs obtained by multiplying the clock signal by multipliers (first multiplier 41, second multiplier 42) each having a multiplication ratio different from one another are switched by the first and second changeover switches 25 and 26 so as to be supplied to the DDS signal processing unit 21 (phase accumulator 211) and the DAC 22.

In this embodiment, for example, the clock frequency of the operation clock for the DDS control unit 24 is $f_{clk}$ 0=40 MHz, and the first multiplier 41 and the second multiplier 42 are used to multiply the clock signal by five and six respectively, thus switching the clock signals of the clock frequencies of $f_{clk}$ 1=200 MHz and $f_{clk}$ 2=240 MHz to be supplied to the DDS 2.

A frequency source that supplies the clock signal with the clock frequency $f_{clk}$ 0, the first and the second multipliers 41 and 42, and the first changeover switch 25 correspond to a clock signal supply unit in this embodiment.

The use of the above-described DDS 2 configured to switch a plurality of clock signals ensures the dividing number N of the variable frequency divider 302 and the clock frequency $f_{clk}$ to be varied as necessary based on the relations of the formulas (3) to (7) described above, thus determining the reference frequency $f_c$ without the spurious frequency $f_{Sn}$ caused by the higher harmonics within a predetermined frequency range. Then, when the phase comparison with the reference frequency signal having the reference frequency $f_c$ is performed to cause the PLL circuit 3 to operate, the frequency synthesizer 1 can output the frequency signal receiving a small influence of the spurious components.

On the other hand, the inventors have been known that, in the frequency synthesizer 1 where the dividing number N of the variable frequency divider 302 varies corresponding to the setting of the reference frequency $f_c$, and the clock frequency $f_{clk}$ that causes the DDS 2 to operate also varies, the influence of the dividing number and the clock frequency on the frequency signal output from the frequency synthesizer 1 cannot be ignored.

For example, a phase noise level Noise [dBc/Hz] generated in the frequency synthesizer 1 is indicated by a following formula (8).

$$\text{Noise}=\text{Noise(PLL)}+10\cdot\log(f_c)+20\cdot\log(N) \quad (8)$$

Here, Noise (PLL) is the phase noise generated in the PLL-IC 30.

According to the formula (7) described above, the relation between the dividing number N of the variable frequency divider 302 and the reference frequency $f_c$, which are configured with respect to the frequency synthesizer 1, is an inverse proportion, and as the dividing number (or the reference frequency) is increased, the reference frequency (or the dividing number) decreases. On the other hand, according to the formula (8), since the change of the dividing number provides the influence with 20 times of log (N), selecting the dividing number as small as possible provides much efficiency for reducing the influence of the phase noise caused by the increase of the reference frequency $f_c$.

In the frequency synthesizer 1 according to the embodiment, based on this consideration, combinations of the clock frequency $f_{clk}$, the reference frequency $f_c$, and the dividing number N are preliminarily stored in a memory (storage unit) 12 such that the spurious components do not exist in the predetermined range and the dividing number is minimum, corresponding to the channel indicating the predetermined output frequency $f_{VCO}$. Then, the frequency synthesizer 1 is configured to include a control unit 11 that accepts an input of a channel setting signal, selects the combination of the clock frequency $f_{clk}$, the reference frequency $f_c$, and the dividing number N corresponding to the channel, switches the first changeover switch 25, sets the digital set value $F_{DATA}$ to the DDS signal processing unit 21, and sets the dividing number to the variable frequency divider 302.

In this aspect, the control unit 11 and the DDS control unit 24 constitute a setting unit of the embodiment.

The following describes an exemplary setting of the clock frequency $f_{clk}$, the reference frequency $f_c$, and the dividing number N with a simple example. The following exemplary calculations merely indicate set values for convenience for understanding the contents of the present invention, and not indicate actual set values.

Tables in FIG. 6 to FIG. 9 each indicate frequencies (cell in upper stage side) of higher harmonics components from the second harmonic to the sixth harmonic and frequencies (cell in lower stage side) of the spurious components of the respective higher harmonics when the clock frequency $f_{clk}$ is changed to 200 (=$f_{clk}$ 1) MHz and 240 (=$f_{clk}$ 2) MHz, and the dividing number N of the variable frequency divider 302 is changed to 20, 23, 26, and 29, in a case where the frequency signals of the output frequencies $f_{VCO}$=920 MHz, 960 MHz, 1000 MHz, and 1040 MHz are output from the VCO 32.

Here, in FIG. 6 to FIG. 9, the cells that include frequencies of the higher harmonics components generated in the ranges (the ranges indicated in gray in FIG. 5) indicated with the formula (3) are indicated by filling with gray. The predetermined frequency range is 48±10 MHz, and the numerals of the spurious frequencies included in the frequency range are underlined in the table.

In the example ($f_{VCO}$=920 MHz) indicated in FIG. 6, in the case of the clock frequency $f_{clk}$ 1=200 MHz, the spurious frequency does not exist within the frequency range of 48±10 MHz at the dividing number N=20 and 26. In the case of the clock frequency $f_{clk}$ 2=240 MHz, the spurious frequency does not exist within the above frequency range at the dividing number N=26. Therefore, when the dividing numbers selected corresponding to the clock frequencies $f_{clk}$ 1 and $f_{clk}$ 2 are compared, the clock frequency $f_{clk}$ 1 having the minimum dividing number (N=20) is selected. Then, based on the dividing number N=20 and $f_{VCO}$=920 MHz, the reference frequency $f_c$=46.000 MHz is calculated.

As the result, as the set value corresponding to $f_{VCO}$=920 MHz, values of "the clock frequency $f_{clk}$ 1=200 MHz, the reference frequency $f_c$=46.000 MHz, and the dividing number N=20" are registered in the memory 12 (see a channel CH10 in FIG. 10).

On the other hand, in the examples of FIG. 7 ($f_{VCO}$=960 MHz) and FIG. 9 ($f_{VCO}$=1040 MHz), the combination where the spurious frequency does not exist within the above frequency range and the dividing number N is minimum exists on the clock frequency $f_{clk}$ 2=240 MHz side (N=23 in FIG. 7 and N=20 in FIG. 9).

As the result, as indicated in a channel CH11 in FIG. 10, as the set values corresponding to $f_{VCO}$=960 MHz, "the clock frequency $f_{clk}$ 2=240 MHz, the reference frequency $f_c$=41.739 MHz, and the dividing number N=23" are registered, and as indicated in a channel CH13, as the set values corresponding to $f_{VCO}=1040$ MHz, "the clock frequency $f_{clk}$ 2=240 MHz, the reference frequency $f_c$=52.000 MHz, and the dividing number N=20" are registered.

Next, in the example of FIG. 8 ($f_{VCO}=1000$ MHz), in both of the clock frequency $f_{clk}$ 1=200 MHz and $f_{clk}$ 2=240 MHz, the dividing numbers of the combination where the spurious frequency does not exist within the above frequency range and the dividing number N is minimum are identical (N=23). Then, in this case, the spurious frequencies (frequencies of adjacent spurious) closest to the above frequency range are compared, thus employing the clock frequency such that a distance (absolute value of the frequency difference) from an upper limit value or a lower limit value within the above frequency range is larger.

According to FIG. 8, in the case of the clock frequency $f_{clk}$ 1=200 MHz, the sixth spurious $f_{S6}$=60.870 MHz is the closest to the upper limit value (58 MHz) in the above frequency range. On the other hand, in the case of the clock frequency $f_{clk}$ 2=240 MHz, the fourth spurious $f_{S4}$=66.087 MHz is closest to the upper limit value (58 MHz) in the above frequency range. A distance Δf (absolute value of the frequency difference) between the spurious component and the upper limit value or the lower limit value (in this example, the upper limit value) in the above frequency range is larger in the clock frequency $f_{clk}$ 2=240 MHz (in the case of the clock frequency $f_{clk}$ 1, Δf=2.870 MHz, and in the case of the clock frequency $f_{clk}$ 2, Δf=8.087 MHz).

As the result, as indicated in a channel CH12 in FIG. 10, as the set value corresponding to $f_{VCO}=1000$ MHz, "the clock frequency $f_{clk}$ 2=240 MHz, the reference frequency $f_c$=43.478 MHz, and the dividing number N=23" is registered.

Figure 11:
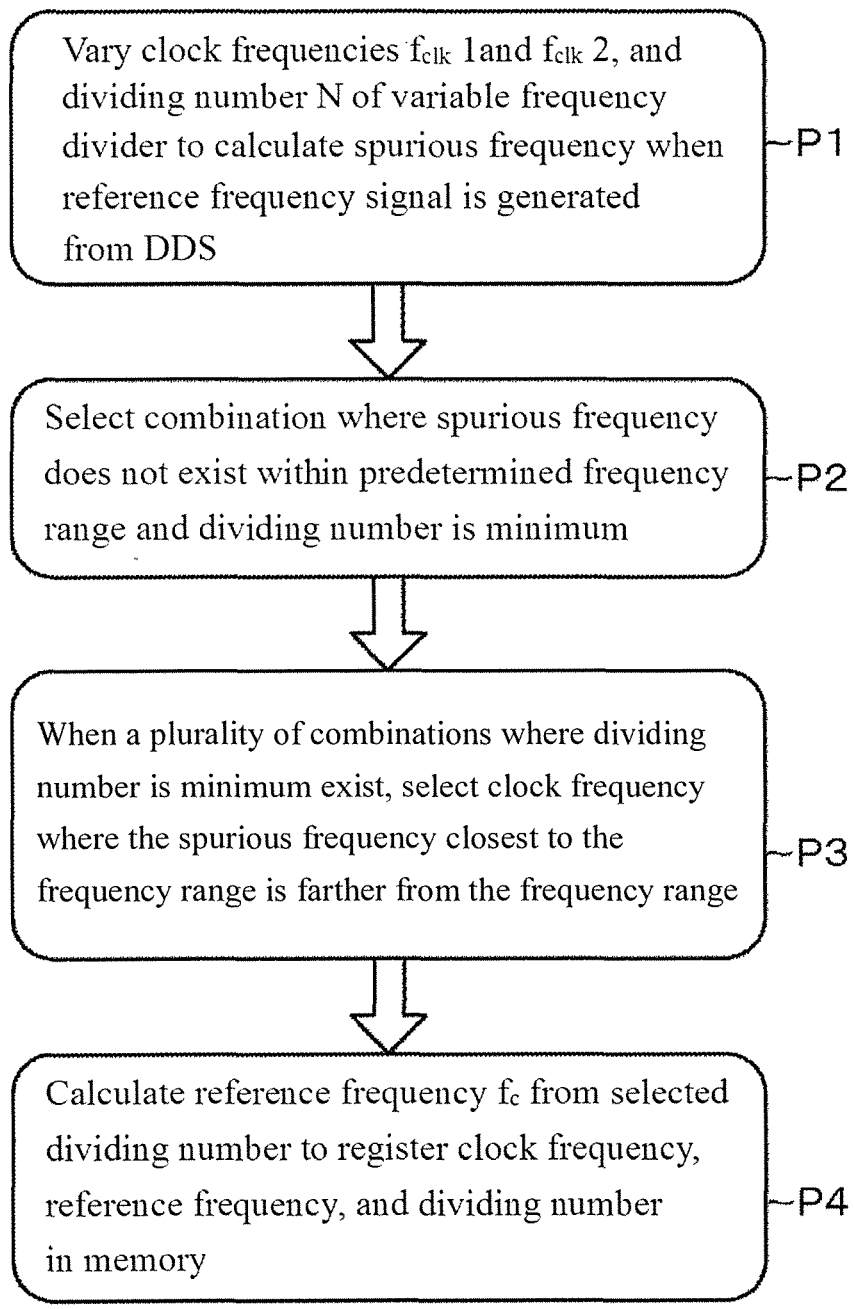
FIG. 11 is an explanatory drawing indicating a procedure for determining respective setting items.

FIG. 11 indicates a calculation procedure of the above-described setting items (the clock frequency $f_{clk}$, the reference frequency $f_c$, and the dividing number N) registered in the memory 12.

First, corresponding to the output frequency $f_{VCO}$ from the frequency synthesizer 1, the clock frequency $f_{clk}$ and the dividing number N of the variable frequency divider 302 are varied to calculate the spurious frequency when the reference frequency signal is generated from the DDS 2 (Step P1).

Next, the combination of the clock frequency $f_{clk}$ and the dividing number N where the spurious frequency does not exist within the predetermined frequency range and the dividing number is minimum is selected (Step P2). Further, when a plurality of the combinations where the dividing number N is minimum exist, the clock frequency where the spurious frequency of an adjacent spurious closest to the above frequency range is farther from the upper limit value or the lower limit value in the frequency range is selected (Step P3).

Then, the reference frequency $f_c$ is calculated from the selected dividing number N, and the combination of the clock frequency $f_{clk}$, the reference frequency $f_c$, and the dividing number N is registered as the channel in association with the output frequency $f_{VCO}$ (Step P4).

As illustrated in FIG. 10, the memory 12 stores, for example, 100 channels as the combination of the setting items.

A description will be given of the action of the frequency synthesizer 1 that includes the above-described configuration.

As illustrated in FIG. 1, the control unit 11 of the frequency synthesizer 1 accepts the choice of the channel registered in the memory 12 from outside, and reads the combination of the setting items corresponding to the selected channel from the memory 12. Subsequently, the control unit 11 sets the dividing number of the variable frequency divider 302 to the PLL-IC 30 based on the read setting items, and outputs information corresponding to the selected clock frequency $f_{clk}$ and the reference frequency $f_c$ to the DDS control unit 24 of the DDS 2.

The DDS control unit 24 executes the switch of the first changeover switch 25 and the second changeover switch 26 based on the selected clock frequency $f_{clk}$. The DDS control unit 24 calculates the digital set value $F_{DATA}$ corresponding to the reference frequency $f_c$ to output to the phase accumulator 211 of the DDS signal processing unit 21, and resets the DAC22.

As the result, the selected clock frequency $f_{clk}$ causes the DDS 2 to operate, and the reference frequency signal of the reference frequency $f_c$ is output to the PLL circuit 3. The phase comparator 301 of the PLL circuit 3 perform the phase comparison of the reference frequency signal and the output signal of the VCO 32 divided by the variable frequency divider 302, so as to increase and decrease the control voltage fed back to the VCO 32 depending on a magnitude of the phase difference.

Then, when the phase difference comes to approximately zero, the PLL circuit 3 is locked to be stabilized at the output frequency $f_{VCO}$, and the frequency signal including a few unnecessary frequency components is output from the VCO 32.

The frequency synthesizer 1 including the DDS 2 according to this embodiment can output the frequency signal with the stable output frequency in a response time of approximately 20 to 30 microseconds even when the channel is switched by, for example, 30 to 40 microseconds.

The frequency synthesizer 1 according to the embodiment provides the following efficiencies. When the frequency synthesizer 1 outputs the frequency signal such that the clock signal for operating the DDS 2 is switched and the reference frequency signal generated in the DDS 2 is used for the phase comparison of the PLL circuit 3, the combination of the clock frequency and the reference frequency where the spurious component does not exist around the reference frequency signal and the dividing number of the variable frequency divider 302 disposed on the frequency synthesizer 1 is minimum is selected. As the result, the unnecessary frequency component in the frequency signal output from the frequency synthesizer 1 is comprehensively reduced and the phase noise is optimized so as to be most lowered.

Figure 12:
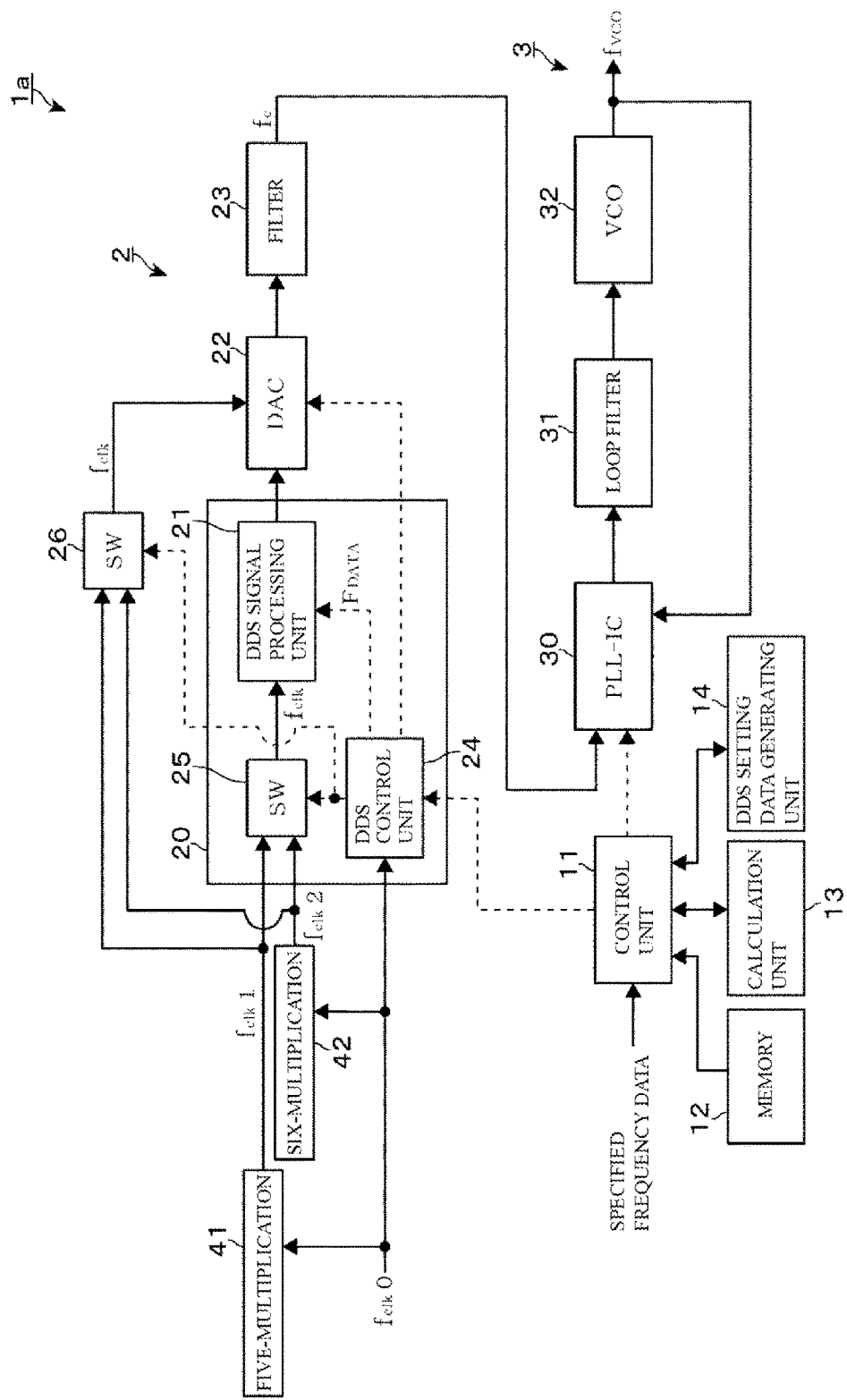
FIG. 12 is a block diagram illustrating a frequency synthesizer according to a second embodiment.
Figure 13:
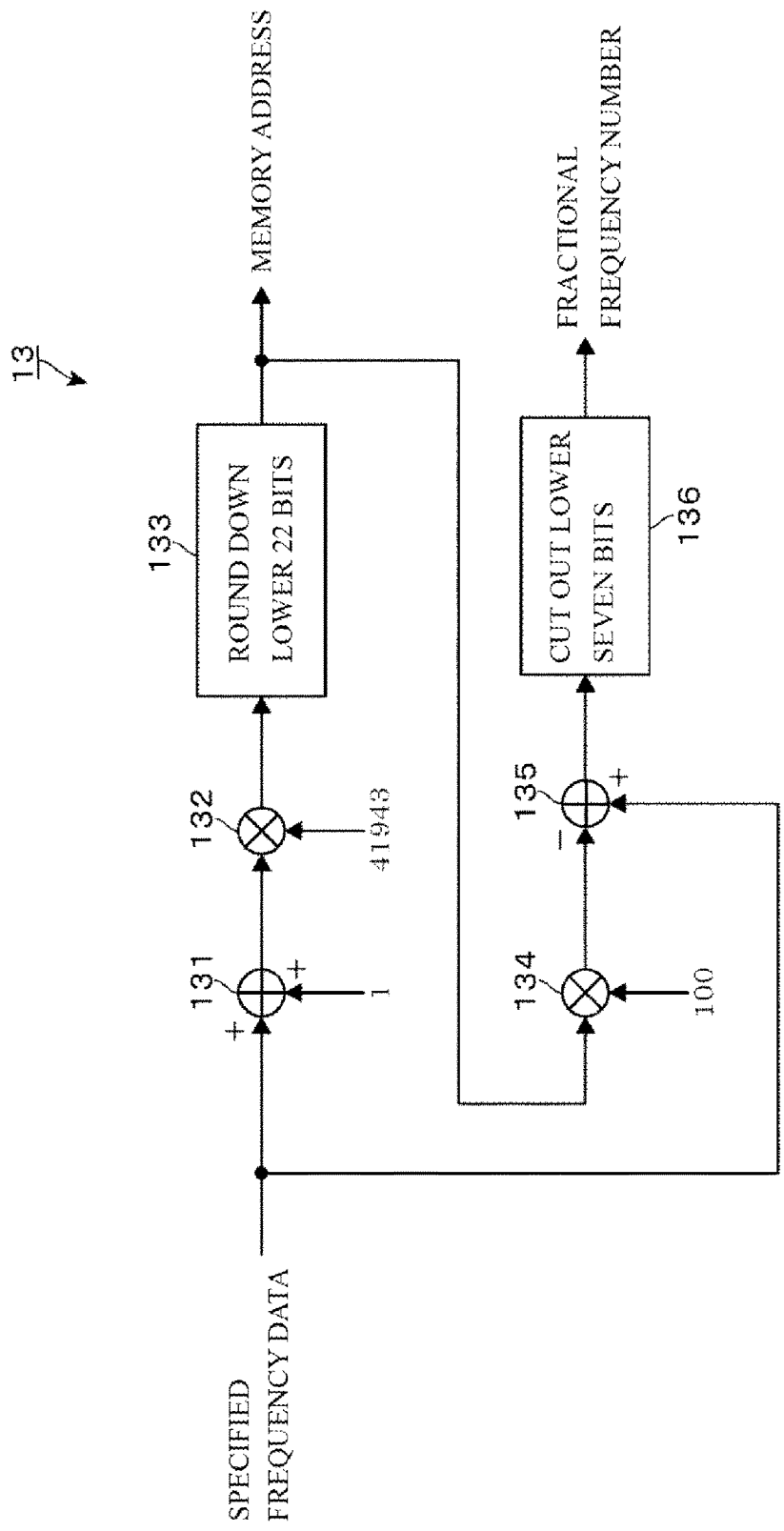
FIG. 13 is a block diagram illustrating a calculation unit disposed on the frequency synthesizer.
Figure 14:
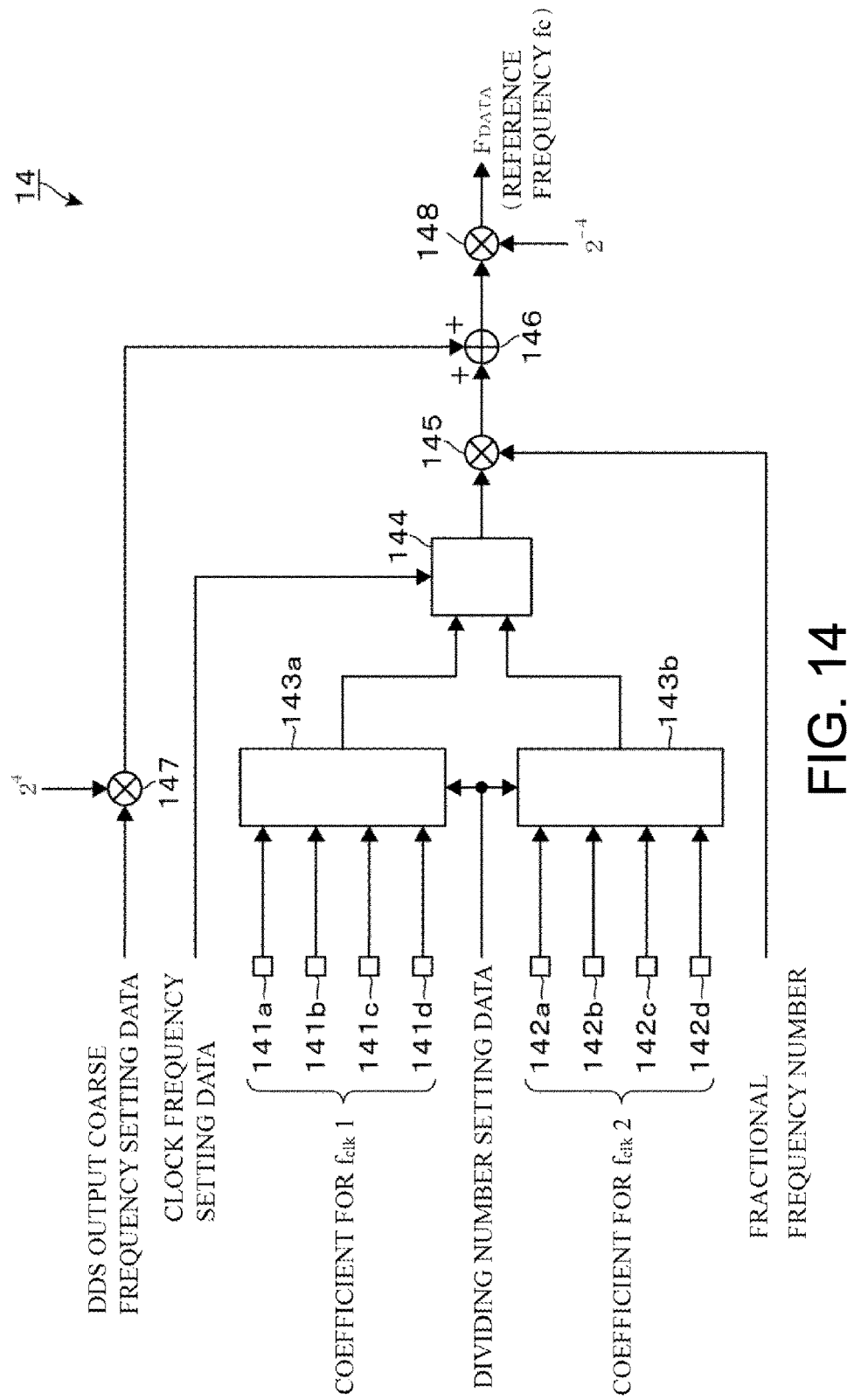
FIG. 14 is a block diagram illustrating a DDS setting data generating unit disposed on the frequency synthesizer.

Next, a description will be given of a frequency synthesizer 1a according to a second embodiment by referring to FIG. 12 to FIG. 15. In FIG. 12 to FIG. 14, the components common to the frequency synthesizer 1 indicated in FIG. 1 to FIG. 3 are given reference numerals common to the reference numerals given in those drawings.

The frequency synthesizer 1a according to the second embodiment is configured to accept the setting of the output frequency $f_{VCO}$ of the VCO 32 at a frequency interval (for example, the interval of 1 kHz) shorter than the intervals (for example, the interval of tens of MHz) of the output frequencies configured in association with the respective channels indicated in FIG. 10.

Here, as described by using FIG. 10, the set value of the output frequency of the VCO 32, the clock frequency $f_{clk}$ selected corresponding to the set value, the reference frequency $f_c$ of the DDS 2, and the dividing number N of the PLL circuit 3 of each channel are preliminarily registered in the memory 12. However, if the data of every output frequency selected at the interval of, for example, 1 kHz is registered, the memory 12 is required to have a huge capacity.

As described by using FIG. 5 to FIG. 9, each data registered in the memory 12 is determined based on the distance Δf between the reference frequency $f_c$ (frequency obtained by dividing the output frequency $f_{VCO}$ of the VCO 32 by the dividing number N) output from the DDS 2 and the spurious frequency $f_{Sn}$ determined by the reference frequency $f_c$ and the clock frequency $f_{clk}$. On the other hand, according to the calculating formula of the spurious frequency $f_{Sn}$ indicated with the formula (4) and the formula (6), in a relatively low order spurious with a large level, even the reference frequency $f_c$ varies by an approximately few kHz, the spurious frequency $f_{Sn}$ does not vary significantly.

Then, it is found that, when the output frequency $f_{VCO}$ of the VCO 32 is gradually varied at intervals of 1 kHz, the values of the clock frequencies $f_{clk}$ 1 and $f_{clk}$ 2 and the dividing number N, which are to be selected, do not vary swiftly corresponding to the variation of the output frequency $f_{VCO}$. Actually, it is preliminarily verified that the clock frequencies $f_{clk}$ 1 and $f_{clk}$ 2, and the dividing number N, which are selected by the above-described method described by using FIG. 5 to FIG. 9, vary at coarser intervals of approximately tens of kHz to hundreds of kHz.

According to this fact, even when the output frequency $f_{VCO}$ of the VCO 32 is set at intervals of 1 kHz, the clock frequencies $f_{clk}$ 1 and $f_{clk}$ 2 and the dividing number N registered in the memory 12 may be set at coarse frequency intervals compared with the intervals of 1 kHz. On the other hand, the reference frequency $f_c$ is required to be set with a high resolution corresponding to the setting intervals of the output frequency $f_{VCO}$.

On the basis of the above-described consideration, the frequency synthesizer 1a of this example includes the memory 12 where the setting data of the clock frequencies $f_{clk}$ 1 and $f_{clk}$ 2 and the dividing number N are registered at intervals of 100 kHz (FIG. 15A). On the other hand, by using set values (specified frequencies) of the output frequency $f_{VCO}$ of the VCO 32 input at intervals of 1 kHz, the selection of the set values of those and the generation of the digital set value $F_{DATA}$ for outputting the frequency signal of the reference frequency $f_c$ from the DDS 2 corresponding to the specified frequency are performed.

In the following description, the clock frequency is selectable from $f_{clk}$ 1=200 MHz and $f_{clk}$ 2=240 MHz, and the dividing number is selectable from N=16, 20, 32, and 40.

For performing the above-described selection of the respective set values and the generation of the digital set value $F_{DATA}$, the frequency synthesizer 1a includes a calculation unit 13 configured to calculate an address of the memory 12 associated with the above-described respective set values and calculate a fractional frequency number used in the generation of the digital set value $F_{DATA}$, both calculations are based on the specified frequency, and a DDS setting data generating unit 14 configured to generate the digital set value $F_{DATA}$.

First, by referring to FIG. 15A, the content of various setting data registered in the memory 12 will be described. For example, when the output frequency $f_{VCO}$ is configured to be specified from 1 MHz to hundreds of MHz at intervals of 1 kHz (0.001 MHz), a value corresponding to a DDS output coarse frequency set value $F_{DATA}'$ for generating the digital set value $F_{DATA}$ is registered in the memory 12 in addition to the clock frequency $f_{clk}$ and the dividing number N selected with the above-described method (see FIG. 5 to FIG. 9) corresponding to the output frequency range of the VCO 32 set at intervals of 100 kHz.

For example, when the output frequency range is 199.900 to 199.999 MHz, the reference frequency $f_c$ is obtained by dividing a minimum value $f_{VCO}$ (min)=199.900 MHz (representative frequency) in the range by the dividing number N based on the formula (7). Then, a digital value $F_C$ of the reference frequency $f_c$ and a digital value $F_{clk}$ of the selected clock frequency $f_{clk}$ are used to calculate the DDS output coarse frequency set value $F_{DATA}'$ based on the formula (2), so as to register the data corresponding to this value in the memory 12 (in FIG. 15A, indicated as "$F_{DATA}$ (199.900)").

In the memory 12, the clock frequency $f_{clk}$, the DDS output coarse frequency set value $F_{DATA}'$, and the dividing number N described above are registered associated with the memory address configured corresponding to a value obtained by cutting out upper four digits of the respective output frequency ranges. That is, to the output frequency $f_{VCO}$ within the above-described output frequency range of 199.900 to 199.999 MHz, the memory address "1989" is set based on the correspondence relation with specified frequency data described later.

As illustrated in FIG. 15B, the various setting data actually registered in the memory 12 is binary data set and processed corresponding to the content of the operation executed by the calculation unit 13 and the DDS setting data generating unit 14, and specific data configurations will be described latter.

The calculation unit 13, whose exemplary configuration is indicated in FIG. 13, calculates the memory address set to the frequency range including the output frequency, and calculates the fractional frequency number for generating the digital set value $F_{DATA}$ of the DDS 2 in combination with the DDS output coarse frequency set value $F_{DATA}'$ registered in the memory 12, based on the set value (specified frequency) of the output frequency $f_{VCO}$ input to the frequency synthesizer 1a.

To the frequency synthesizer 1a, the specified frequency data (binary data) is input. The specified frequency data is a predetermined channel number corresponding to the set value (specified frequency) of the output frequency $f_{VCO}$. For example, to the output frequency range of "1.000 to 1.099 MHz" indicated in FIG. 15A, the specified frequency data of "0 to 99" corresponds at intervals of 1 kHz, and to the output frequency range of "1.100 to 1.199 MHz," the specified frequency data of "100 to 199" corresponds. Therefore, it is found that, to the output frequency range of "199.900 to 199.999 MHz," the specified frequency data of "198900 to 198999" corresponds, and to the output frequency range of "200.000 to 200.099 MHz," the specified frequency data of "199000 to 199099" corresponds.

To the specified frequency data input to the frequency synthesizer 1a, an addition unit 131 adds "1," and further, a multiplication unit 132 multiplies the specified frequency data by "41943" as the value corresponding to "$2^{22}/100$." To the thus obtained data, a round-down calculation unit 133 performs an operation to round down lower 22 bits, such that the result is the memory address.

The above-described operation is performed to calculate how many times (natural number) of 100 the specified frequency data corresponds to. For example, when the specified frequency data is "199001 (corresponding to the specified frequency 200.001 MHz)," performing the above-described operation outputs the binary data "11111000110" corresponding to the memory address "1990." On the other hand, when the specified frequency data is "198999 (corresponding to the specified frequency 199.999 MHz)," performing the similar operation outputs the binary data "11111000101" corresponding to the memory address "1989."

Further, in the calculation unit 13, a multiplication unit 134 multiplies the output from the round-down calculation unit 133 by "100," and an addition unit 135 further obtains a difference value from the specified frequency. Then, a cut-out calculation unit 136 cuts out lower seven bits of the difference value to obtain the fractional frequency number.

This operation is performed to take out the value of the lower two digits rounded down at the operation by the round-down calculation unit 133 that counts the specified frequency data at intervals corresponding to 100 kHz. For example, the data of the fractional frequency number taken out at the specified frequency data of "199001 (the specified frequency 200.001 MHz)" is "0000001" corresponding to the value "01" as the lower two digits of "199001." On the other hand, the data taken out at the specified frequency data of "198999 (the specified frequency 199.999 MHz)" is "1100011" corresponding to the value "99" as the lower two digits of "198999."

As illustrated in FIG. 15B, in the memory 12, "clock frequency setting data" for setting the clock frequency $f_{clk}$, the above-described "DDS output coarse frequency setting data," and "dividing number setting data" for setting the dividing number N are registered associated with the memory address output from the calculation unit 13.

To the clock frequency setting data, the value of "0/1" is assigned corresponding to the respective clock frequencies $f_{clk}$, 1=200 MHz and $f_{clk}$, 2=240 MHz. The DDS output coarse frequency set value $F_{DATA}'$ is the binary data described at FIG. 15A, and the data of "$F_{DATA}'$" is registered corresponding to the operation performed in the DDS setting data generating unit 14 described below. As the dividing number setting data, the value of "00/01/10/11" is assigned corresponding to the dividing number "N=16, 20, 32, and 40" selectable in this example.

For example, when the specified frequency is "199.999 MHz (the specified frequency data 198999)," the respective setting data corresponding to the memory address "1989" output from the calculation unit 13 is the value corresponding to the output frequency range "199.900 to 199.999 MHz" indicated in FIG. 15A. That is, the respective setting data includes the setting data that selects the clock frequency $f_{clk}$=200 MHz (=$f_{clk}$ 1) and the dividing number N=20, and the digital set value ($F_{DATA}$ (199.900)), which is calculated based on the formula (7) and the formula (2) with use of the clock frequency and the dividing number, of the DDS 2 in the representative frequency $f_{VCO}$ (min)=199.900 MHz.

When the calculation unit 13 outputs the memory address based on the specified frequency, the control unit 11 reads out the setting data.

When the specified frequency is "200.001 MHz (the specified frequency data 199001)," the respective setting data corresponding to the output frequency range "200.000 to 200.099 MHz," registered based on the similar consideration, is read out.

Next, a description will be given of the outline of the operation performed in the DDS setting data generating unit 14 whose exemplary configuration is indicated in FIG. 14. When the specified frequency data (channel number associated with the output frequency $f_{VCO}$ to be output from the VCO 32) is input from outside, the digital set value $F_{DATA}$ to be set to the DDS 2 is calculated (the formula (2)) based on the reference frequency $f_c$ as a value obtained by dividing the specified frequency by the dividing number N corresponding to the dividing number setting data read from the memory 12.

In the calculation of the digital set value $F_{DATA}$, in the memory 12, data that corresponds to the DDS output coarse frequency set value $F_{DATA}'$ in increments of 100 kHz is registered in association with the output frequency range. Then, the DDS setting data generating unit 14 only calculates the digital set value corresponding to the lower two digits of the specified frequency rounded down with the DDS output coarse frequency.

According to FIG. 15A, for example, when the specified frequency is "199.999 MHz (199999 kHz)," the dividing number is N=20, thus the reference frequency is $f_c$=199999/20 (19900+99)/20) [kHz]. On the other hand, the DDS output coarse frequency set value $F_{DATA}'$ corresponding to "199900/20 kHz" is obtained from the data registered in the memory 12, thus it is enough to generate the setting data corresponding to the remaining "99/20 kHz."

When the specified frequency is "199999 kHz," the above-described formula (2) can be rewritten to a formula (2)' below.

$$F_{DATA}(199999) = F_c(199999)/(F_{clk}/(2^{20})) \quad (2)'$$
$$= \{F_c(199900) + F_c(99)\}/(F_{clk}/(2^{20}))$$
$$= F'_{DATA} + F_c(99)/(F_{clk}/(2^{20}))$$

Then, the setting data corresponding to the above-described "99/20 kHz" can be calculated from the second term on the right side of (2)' "$F_c$ (99)/($F_{clk}/(2^{20})$)."

Here, as defined in the explanation of the formula (2), $F_c$ is the digital value of the reference frequency. Therefore, the digital value $F_c$ (99) corresponding to the specified frequency 99 kHz is a value of 99 times of the digital value $F_c$ (1) corresponding to the specified frequency 1 kHz. Accordingly, the second term on the right side of (2)' can be rewritten to "99·$F_c$ (1)/($F_{clk}/(2^{20})$)," and when "$F_c$ (1)/($F_{clk}/(2^{20})$)" is assumed as a coefficient, the value of "99" multiplied to the coefficient is exactly the fractional frequency number output from the calculation unit 13.

Therefore, when the dividing number N=20 is selected, the coefficient corresponding to "$F_c$ (1)/($F_{clk}/(2^{20})$)" is preliminarily registered, thus multiplying the coefficient to the fractional frequency number output from the calculation unit 13 ensures the setting data corresponding to "99/20 kHz" to be calculated. Then, adding this calculation result to the DDS output coarse frequency set value $F_{DATA}'$ obtained by reading from the memory 12 ensures the digital set value $F_{DATA}$ corresponding to the reference frequency $f_c$ to be generated.

The DDS setting data generating unit 14 illustrated in FIG. 14 is configured to perform the above-described operation.

Here, as described above, the frequency synthesizer 1a of this example is configured to select four kinds of the dividing number N, and the selected dividing number N varies corresponding to the selection of the clock frequencies $f_{clk}$ 1 and $f_{clk}$ 2. Therefore, the preliminary registration of eight kinds of the coefficient ($F_c$ (1)/($F_{clk}/(2^{20})$)) determined corresponding to the combination of the dividing number N and the clock frequencies $f_{clk}$ 1 and $f_{clk}$ 2 ensures the generation of the reference frequency $f_c$ corresponding to every case.

Then, the DDS setting data generating unit 14 includes registers 141a to 141d that include four kinds of the coefficient selected corresponding to the respective dividing numbers N (=16, 20, 32, and 40) when the clock frequency $f_{clk}1$ is selected, and registers 142a to 142d that include four kinds of the coefficient selected corresponding to the respective dividing numbers N when the clock frequency $f_{clk}2$ is selected. For reducing the influence of the quantization error in accordance with the setting of the coefficient "$F_c(1)/(F_{clk}/(2^{20}))$" corresponding to the specified frequency in increments of 1 kHz, in the respective registers 142a to 142d, the value where the above-described coefficient is multiplied by $2^4$ to increase the number of significant figures is registered. The adjustment of the number of digits may be omitted as necessary corresponding to the accuracy required to the frequency synthesizer 1a (in this case, the operations in multiplication units 147 and 148 described below are also omitted).

Then, based on the dividing number setting data read from the memory 12, preceding stage selectors 143a and 143b read the coefficients of the corresponding dividing numbers N, so as to output the coefficients to a subsequent stage selector 144.

The subsequent stage selector 144 selects the coefficient of the clock frequency $f_{clk}1/f_{clk}2$ side appropriate for the output of the specified frequency from the coefficients selected by the two preceding stage selectors 143a and 143b based on the clock frequency setting data read from the memory 12. Multiplying the coefficient by the fractional frequency number output from the calculation unit 13 in a multiplication unit 145 calculates the setting data corresponding to the second term on the right side of the above-described formula (2)'.

On the other hand, to the value corresponding to the DDS output coarse frequency setting data read from the memory 12, the multiplication unit 147 multiplies the value by "$2^4$" in association with the coefficient registered in the registers 142a to 142d, after that, an addition unit 146 adds the result to the setting data of the fractional side, and further, the multiplication unit 148 performs a process of multiplying by $2^{-4}$ to perform the adjustment of the number of digits, thus generating the digital set value $F_{DATA}$ corresponding to the reference frequency $f_c$. The DDS setting data generating unit 14 outputs the digital set value $F_{DATA}$.

The above-described explanation of the frequency synthesizer 1a according to the second embodiment by using FIG. 12 to FIG. 15 is summarized as follows. The memory (storage unit) 12 stores the DDS output coarse frequency set value $F_{DATA}'$ of the reference frequency $f_c$ corresponding to the predetermined representative frequency (for example, the minimum value of the respective frequency ranges) in association with the clock frequency $f_{clk}$ and the dividing number N determined with the method described by using FIG. 5 to FIG. 9 by the plurality of the frequency ranges divided, for example, in increments of 100 kHz. Then, the calculation unit 13 calculates the memory address based on which frequency range among the plurality of the frequency ranges has the value to which the set value (specified frequency) of the output frequency of the VCO 32 corresponds. The DDS setting data generating unit 14 generates the digital set value $F_{DATA}$ corresponding to the reference frequency $f_c$ of the specified frequency based on the value (setting data output from the multiplication unit 145) corresponding to the value obtained by dividing the difference value (fractional frequency number) between the representative frequency in the frequency range specified in the calculation unit 13 and the specified frequency by the dividing number N, and the DDS output coarse frequency set value $F_{DATA}'$ registered in the memory 12 corresponding to the representative frequency.

Next, a description will be given of the action of the frequency synthesizer 1a according to the second embodiment. When the set value (specified frequency data) of the output frequency $f_{VCO}$ of the VCO 32 is input from outside, the calculation unit 13 calculates the memory address and the fractional frequency number.

The control unit 11 reads the clock frequency setting data, the DDS output coarse frequency setting data, and the dividing number setting data from the memory 12 based on the calculated memory address, so as to input to the DDS setting data generating unit 14. To the DDS setting data generating unit 14, the fractional frequency number output from the calculation unit 13 is input, and the digital set value $F_{DATA}$ of the reference frequency $f_c$ appropriate for outputting the specified frequency from the VCO 32 is generated based on the data.

Further, the control unit 11 inputs the clock frequency setting data read from the memory and the digital set value $F_{DATA}$ obtained from the DDS setting data generating unit 14 to the DDS control unit 24 of the DDS 2. As the result, such as the switch of the first changeover switch 25 and the second changeover switch 26, and the setting of the phase accumulator 211 of the DDS signal processing unit 21 corresponding to the digital set value $F_{DATA}$ are performed.

The control unit 11 outputs the dividing number setting data read from the memory 12 to the PLL-IC 30, so as to perform the setting of the dividing number of the variable frequency divider 302.

These settings ensures varying the output frequency $f_{VCO}$ of the VCO 32 in increments of 1 kHz, while, similar to the frequency synthesizer 1 according to the first embodiment, comprehensively reducing the unnecessary frequency component in the frequency signal and outputting the optimized frequency signal such that the phase noise is most lowered.

Here, in the frequency synthesizer 1a according to the second embodiment illustrated in FIG. 12 to FIG. 15, the description was given of the case where the data corresponding to the DDS output coarse frequency set value $F_{DATA}'$ obtained from the reference frequency $f_c$ is registered in the memory 12, and the data is read to generate the digital set value $F_{DATA}$ of the reference frequency $f_c$ in the DDS setting data generating unit 14.

On the other hand, similar to the frequency synthesizer 1 according to the first embodiment, the configuration where the digital set value $F_{DATA}$ is calculated in the DDS control unit 24 may be employed.

In this case, in the memory 12, the value (for example, in the case of the minimum value $f_{VCO}$ (min)=199.900 MHz and the dividing number N=20, the value corresponding to 199900 kHz/20) corresponding to the reference frequency $f_c$ corresponding to the minimum value of the output frequency range is registered.

In the DDS setting data generating unit 14, it is not necessary to change the coefficient corresponding to the selected clock frequency $f_{clk}$, thus the DDS setting data generating unit 14 includes only the four registers 141a to 141d corresponding to the four dividing numbers N.

Then, in the registers 141a to 141d, the coefficients (1/dividing number N) necessary for changing the reference frequency by 1 kHz are registered, such that the coefficients are selected by the preceding stage selector 143a corresponding to the selected dividing number N. Then, the selected coefficient is multiplied by the fractional frequency number in the multiplication unit 145, such that the multiplication value is added to the calculated reference frequency $f_c$ (min), which is read from the memory 12, so as to be output to the DDS control unit 24 as the reference frequency $f_c$.

In the frequency synthesizers 1 and 1a according to the above-described first and second embodiments, the number of the switchable clock signals is not limited to the two examples indicated in FIG. 1 and FIG. 12. Three or more clock signals that have different clock frequencies may be used freely switchably. The method for preparing the plurality of clock signals having different clock frequencies is not limited to the case where the operation clock of the DDS-IC 20 such as the DDS control unit 24, indicated in FIG. 1 and FIG. 12, is multiplied. The high frequency signals may be divided by the frequency dividers having the dividing number different from one another, and the multiplication ratio of the multiplier and the dividing number of the frequency divider may be variable. Further, the oscillators having the oscillation frequencies different from one another may supply the clock signals having the different clock frequencies.

The frequency synthesizers 1 and 1a may divide the frequency signal supplied from the DDS 2 to have the divided frequency signal as the reference frequency. As described with the formula (8), while the frequency signal divided by the frequency divider includes the phase noise, it does not deny to dispose the frequency divider on the output side of the DDS 2 insofar as the level without problems as the influence to the output frequency of the VCO 32.

The invention claimed is:
1. A frequency synthesizer, comprising:
a PLL circuit that includes a voltage control oscillator, a variable frequency divider, a phase comparator, and a loop filter, the variable frequency divider dividing a frequency signal output from the voltage control oscillator, the phase comparator extracting a phase difference between a phase of the divided frequency signal and a phase of a reference frequency signal, the loop filter supplying the voltage control oscillator with a control voltage corresponding to the phase difference;
a DDS configured to operate based on a clock signal to generate the reference frequency signal having a reference frequency, the reference frequency corresponding to a value obtained by dividing a set value of an output frequency of the frequency signal by a dividing number, the frequency signal being output from the voltage control oscillator, the dividing number being set in the variable frequency divider;
a clock signal supply unit configured to supply the clock signal to the DDS from a plurality of preliminarily prepared clock frequencies, the clock signal corresponding to a selected clock frequency;
a storage unit storing the clock frequency, the reference frequency, and a minimum dividing number in association with one another, the reference frequency is preliminarily obtained such that a frequency of a spurious component does not exist in a predetermined frequency range and the dividing number of the variable frequency divider is minimum, the spurious component being included in a used frequency band of the DDS while the DDS is operated with the clock signal having the clock frequency selected from the plurality of the clock frequencies so as to generate the reference frequency signal having the reference frequency from the DDS, and
a setting unit configured to select a combination of the clock frequency, the reference frequency, and the minimum dividing number corresponding to the set value of the output frequency so as to set the clock signal supply unit, the DDS, and the variable frequency divider, wherein
the storage unit stores the frequency of the spurious component generated due to the clock frequencies different from one another in association with the clock signal having the clock frequency where an absolute value of a difference between an upper/lower limit value of the frequency range and the frequency of an adjacent spurious component closest to the frequency range becomes maximum, the reference frequency, and the minimum dividing number while the frequency signal with the reference frequency associated with the minimum dividing number is generated by the DDS, and when the clock signal supply unit is prepared for supplying the clock signals such that the frequency of the spurious component does not exist within the predetermined frequency range and the clock frequencies are different from one another.

2. The frequency synthesizer according to claim 1, comprising:
a digital/analog conversion unit configured to convert the frequency signal output from the DDS to an analog signal to output, wherein
the digital/analog conversion unit operates based on the clock signal supplied from the clock signal supply unit.

3. A frequency synthesizer, comprising:
a PLL circuit that includes a voltage control oscillator, a variable frequency divider, a phase comparator, and a loop filter, the variable frequency divider dividing a frequency signal output from the voltage control oscillator, the phase comparator extracting a phase difference between a phase of the divided frequency signal and a phase of a reference frequency signal, the loop filter supplying the voltage control oscillator with a control voltage corresponding to the phase difference;
a DDS configured to operate based on a clock signal to generate the reference frequency signal having a reference frequency, the reference frequency corresponding to a value obtained by dividing a set value of an output frequency of the frequency signal by a dividing number, the frequency signal being output from the voltage control oscillator, the dividing number being set in the variable frequency divider;
a clock signal supply unit configured to supply the clock signal to the DDS from a plurality of preliminarily prepared clock frequencies, the clock signal corresponding to a selected clock frequency;
a storage unit storing the clock frequency, the reference frequency, and a minimum dividing number in association with one another, the reference frequency is preliminarily obtained such that a frequency of a spurious component does not exist in a predetermined frequency range and the dividing number of the variable frequency divider is minimum, the spurious component being included in a used frequency band of the DDS while the DDS is operated with the clock signal having the clock frequency selected from the plurality of the clock frequencies so as to generate the reference frequency signal having the reference frequency from the DDS, and
a setting unit configured to select a combination of the clock frequency, the reference frequency, and the minimum dividing number corresponding to the set value of the output frequency so as to set the clock signal supply unit, the DDS, and the variable frequency divider, wherein the DDS includes a DDS setting unit configured to perform a setting of a digital set value corresponding to the reference frequency obtained from the setting unit and operate based on an operation clock supplied from outside, and the clock signal supply unit includes a multiplier configured to multiply the operation clock by multiplication ratios different from one another so as to prepare the clock signals of the plurality of the clock frequencies.

4. The frequency synthesizer according to claim 3, comprising:

a digital/analog conversion unit configured to convert the frequency signal output from the DDS to an analog signal to output, wherein the digital/analog conversion unit operates based on the clock signal supplied from the clock signal supply unit.

5. A frequency synthesizer, comprising:

a PLL circuit that includes a voltage control oscillator, a variable frequency divider, a phase comparator, and a loop filter, the variable frequency divider dividing a frequency signal output from the voltage control oscillator, the phase comparator extracting a phase difference between a phase of the divided frequency signal and a phase of a reference frequency signal, the loop filter supplying the voltage control oscillator with a control voltage corresponding to the phase difference;

a DDS configured to operate based on a clock signal to generate the reference frequency signal having a reference frequency, the reference frequency corresponding to a value obtained by dividing a set value of an output frequency of the frequency signal by a dividing number, the frequency signal being output from the voltage control oscillator, the dividing number being set in the variable frequency divider;

a clock signal supply unit configured to supply the clock signal to the DDS from a plurality of preliminarily prepared clock frequencies, the clock signal corresponding to a selected clock frequency;

a storage unit storing the clock frequency, the reference frequency, and a minimum dividing number in association with one another, the reference frequency is preliminarily obtained such that a frequency of a spurious component does not exist in a predetermined frequency range and the dividing number of the variable frequency divider is minimum, the spurious component being included in a used frequency band of the DDS while the DDS is operated with the clock signal having the clock frequency selected from the plurality of the clock frequencies so as to generate the reference frequency signal having the reference frequency from the DDS, and a setting unit configured to select a combination of the clock frequency, the reference frequency, and the minimum dividing number corresponding to the set value of the output frequency so as to set the clock signal supply unit, the DDS, and the variable frequency divider, wherein the storage unit stores the reference frequency corresponding to a predetermined representative frequency included in each of a preliminarily divided plurality of frequency ranges in association with the clock frequency and the minimum dividing number for each of the frequency ranges, and the frequency synthesizer includes: a calculation unit configured to calculate which frequency range among the plurality of the frequency ranges has a value to which the set value of the frequency corresponds, and a generating unit configured to generate a reference frequency of the set value of the frequency based on a value obtained by dividing a difference value between the representative frequency in the frequency range specified by the calculation unit and the set value of the frequency by a dividing number set in the variable frequency divider, and a reference frequency stored corresponding to the representative frequency.

6. The frequency synthesizer according to claim 5, comprising:

a digital/analog conversion unit configured to convert the frequency signal output from the DDS to an analog signal to output, wherein the digital/analog conversion unit operates based on the clock signal supplied from the clock signal supply unit.

* * * * *